United States Patent [19]
Gat et al.

[11] 4,214,918
[45] Jul. 29, 1980

[54] METHOD OF FORMING POLYCRYSTALLINE SEMICONDUCTOR INTERCONNECTIONS, RESISTORS AND CONTACTS BY APPLYING RADIATION BEAM

[75] Inventors: Arnon Gat; Levy Gerzberg, both of Stanford; James F. Gibbons, Palo Alto, all of Calif.

[73] Assignee: Stanford University, Stanford, Calif.

[21] Appl. No.: 950,828

[22] Filed: Oct. 12, 1978

[51] Int. Cl.$^2$ ............................................ H01L 21/263
[52] U.S. Cl. ................................. 148/1.5; 148/187; 219/121 L; 427/53.1; 357/23; 357/59; 357/91
[58] Field of Search ................... 148/1.5, 187; 357/91, 357/59, 23; 219/121 L; 427/53, 35

[56] References Cited
U.S. PATENT DOCUMENTS

| | | | |
|---|---|---|---|
| 3,585,088 | 6/1971 | Schwuttle et al. | 148/174 |
| 3,771,026 | 11/1973 | Asai et al. | 317/234 R |
| 3,950,187 | 4/1976 | Kirkpatrick | 148/1.5 |
| 4,059,461 | 11/1977 | Fan et al. | 148/1.5 |
| 4,063,967 | 12/1977 | Graul et al. | 148/1.5 |
| 4,087,571 | 5/1978 | Kamins et al. | 427/86 |

FOREIGN PATENT DOCUMENTS 2208271  8/1973  Fed. Rep. of Germany .

OTHER PUBLICATIONS

Antonenko et al., ". . . Impurity in Si After Laser Annealing", Sov. Phys. Semicond. 10, (1976), 81.
Bhatia et al., "Isolation Process . . . ", IBM-TDB, 19, (1977), 4171.
Poponiak et al., "Gettering . . . Implant Damage . . . ", IBM-TDB, 19, (1976), 2052.
Shtyrkov et al., "Local Laser Annealing . . . ", Sov. Phys. Semicond. 9, (1976), 1309.
Narayan et al., ". . . Laser and Thermal Annealing . . . Si", J. Appl. Phys. 49, (Jul. 1978), 3912.
Kirkpatrick et al., Si Solar Cells . . . ", IEEE Trans. Electron Devices, ED-24, (1977), 429.
Fan et al., "Crystallization . . . by . . . Laser Heating", Appl. Phys. Letts. 27, (1975), 224.
Von Gutfeld, "Crystallization of Si . . . ", IBM-TDB, 19, (1977), 3955.
Joshi et al., ". . . Impurity Migrations . . . by Lasers", IBM-TDB, 11, (1968), 104.
Young et al., "Laser Annealing . . . B . . . Implanted Si", Appl. Phys. Letts. 32, (1978), 139.
Kachurin et al., "Annealing . . . by Laser . . . Pulses", Sov. Phys. Semicond. 9, (1976), 946.
Kutukova et al., "Laser Annealing . . . ", Sov. Phys. Semicond. 10, (1976), 265.
Battaglin et al., ". . . Laser Annealing . . . Implanted Si", Phys. Stat. Solids, 49a, (1978), 347.
Foti et al., ". . . Laser Annealing . . . Si . . . ", Appl. Phys. 15, (1978), 365.
Csepregi et al., ". . . Epitaxial Regrowth . . . ", J. Appl. Phys. 49, (1978), 3906.
Platakis, ". . . Laser . . . Metal-S/C . . . Connections . . . ", Jour. Appl. Phys., 47, (1976), 2120.
Bogatyrev et al., "P-N Junctions . . . Laser Pulse Heating", Sov. Phys. Semicond. 10, (1976), 826.

*Primary Examiner*—L. Dewayne Rutledge
*Assistant Examiner*—Upendra Roy
*Attorney, Agent, or Firm*—Flehr, Hohbach & Test

[57] ABSTRACT

Low resistance, doped polycrystalline semiconductor connection patterns are fabricated by scanning a doped polycrystalline layer with a laser beam thereby increasing the crystal grain size, reducing defects in the grains, increasing charge carrier mobility and as a result reducing material resistivity. Semiconductor devices having increased circuit density and speed are realized through use of laser annealed polycrystalline semiconductor resistors, contacts and interconnections.

16 Claims, 6 Drawing Figures

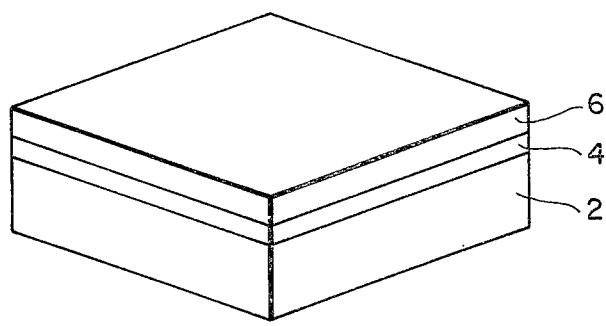
FIG__1
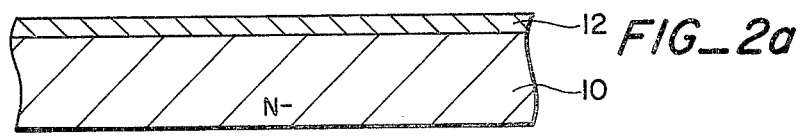
FIG__2a
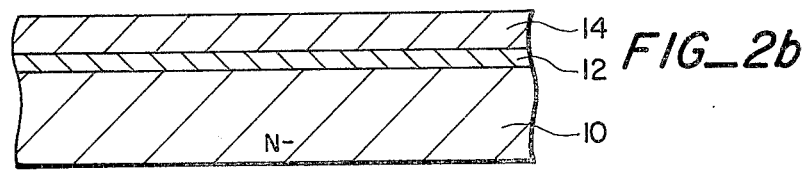
FIG__2b
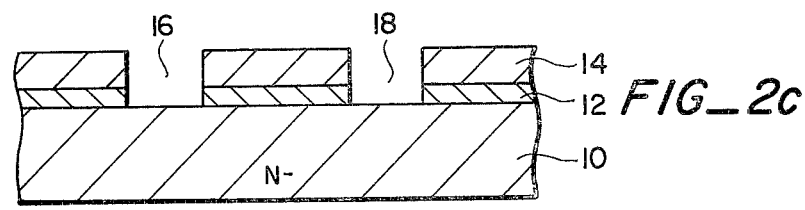
FIG__2c
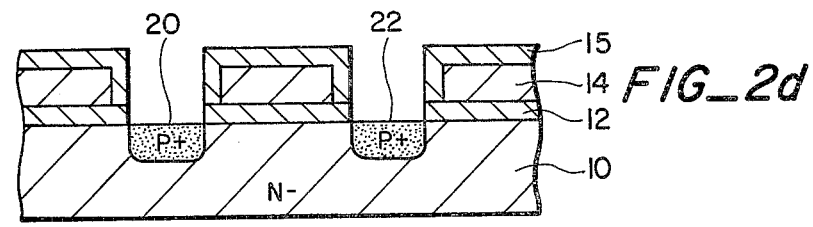
FIG__2d
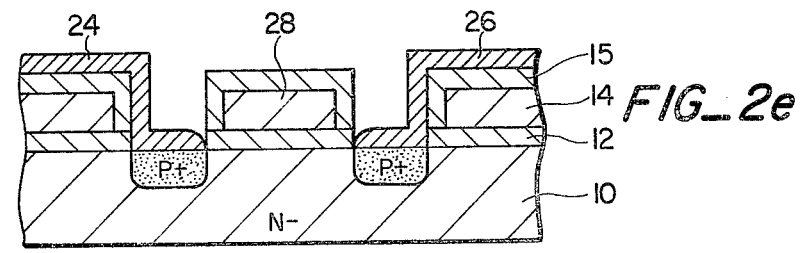
FIG__2e

METHOD OF FORMING POLYCRYSTALLINE SEMICONDUCTOR INTERCONNECTIONS, RESISTORS AND CONTACTS BY APPLYING RADIATION BEAM

BACKGROUND OF THE INVENTION

This invention relates generally to semiconductor processes, and more particularly the invention relates to a method of forming low resistance semiconductor material and resulting devices.

Modern digital electronic circuits are typically embodied in high density integrated circuits formed in and on monolithic single crystalline semiconductor bodies. The integrated circuits are defined in the monocrystalline semiconductor body by the selective introduction of dopants to define the various components of the circuit. Interconnection of the components entails the formation of metal layers or doped polycrystalline semiconductor layers from which interconnect patterns are defined through use of photoresist masking and etch techniques. The major limitations on power consumption and speed of operation of integration circuits lies in the density of the circuit and the resistivity of the interconnect lines. This limitation becomes more severe as line width is decreased to allow for higher density circuits. The disadvantages of polysilicon interconnections and gate technology due to the relative high resistivity of doped polycrystalline silicon are discussed in the Electro Chemical Society Extended Abstracts Volume 78-1 (Abstract No. 274), Volume 77-2 (Abstract No. 330, No. 331, and No. 360).

In the fabrication of semiconductor devices doping techniques are used to form the regions of P and N conductivity type. Both diffusion and ion implantation techniques are well known for introducing dopants into semiconductor material.

Diffusion typically involves a high temperature process for driving into semiconductor material dopant atoms from a vapor. Ion implantation offers greater accuracy in doping, however the lattice structure of the monocrystalline semiconductor material is damaged by ion implantation and also not all of the ions are electrically active. Therefore, annealing is required to ameliorate the lattice damage from ion implantation and activate the dopants. The annealing can be performed by heating the semiconductor body at an elevated temperature, but the high temperature causes diffusion of impurities within the semiconductor body.

Recently the use of laser irradiation has been proposed for annealing ion implantation damage in semiconductor material. The use of a laser rapidly heats selected areas of the semiconductor material without the need for heating the entire semiconductor body in a furnace.

Hutchins and Laff, IBM Technical Disclosure Bulletin Vol. 16, No. 10 March 1974, disclose the use of a scanning laser to improve polysilicon for device fabrication therein. Doping of the polysilicon is performed after the laser scanning. Fan and Zieger disclose in U.S. Pat. No. 4,059,461 the use of a laser beam to crystallize an amorphous semiconductor film formed on a substrate in a photovoltaic application.

SUMMARY OF THE INVENTION

An object of the present invention is an improved method of forming polycrystalline semiconductor material.

Another object of the invention is an improved method of forming low resistance paths and electrical contacts in semiconductor devices.

Still another object of the invention is a semiconductor device with increased circuit density and speed.

Yet another object of the invention is a method of forming improved semiconductor devices which method is compatible with conventional semiconductor fabrication techniques.

Briefly, in accordance with the present invention a polycrystalline semiconductor layer is formed on a substrate. The polycrystalline layer is doped with an impurity either simultaneously with the formation of the layer or subsequently by conventional doping techniques. A radiation beam is then applied to the doped polycrystalline layer which reduces the resistivity of the irradiated polycrystalline material. The beam is preferably either a laser or electron beam and may be either continuous wave or pulsed.

In a preferred embodiment the polycrystalline material is silicon and the substrate includes an amorphous layer on which the polycrystalline silicon is formed.

A feature of a device in accordance with the present invention is a contact and interconnect pattern which have low resistance and reduced size.

Importantly, the polycrystalline material is doped prior to application of the radiation beam. The beam thus activates the dopants which, coupled with the increased crystalline structure, provides increased conductivity thereby permitting reduced size of the conductors.

The invention and objects and features thereof will be more readily apparent from the following detailed description and appended claims when taken with the drawing.

BRIEF DESCRIPTION OF THE DRAWING

FIG. 1 is a perspective view of one sample used in comparing a device in accordance with the invention with prior art devices.

FIG. 2a to 2e illustrates in cross section the steps in fabricating a silicon gate MOS transistor in accordance with the invention.

DETAILED DESCRIPTION OF THE ILLUSTRATED EMBODIMENT

Advantages achieved with the present invention can be illustrated through a comparison of sample devices including doped polysilicon samples without annealing, doped polysilicon samples with thermal annealing, doped polysilicon samples with laser annealing in accordance with the present invention, and doped polycrystalline samples which have been annealed both thermally and by laser means.

Referring to FIG. 1, each sample comprises a monocrystalline silicon substrate 2 having a major surface of which a 1,000 angstrom layer 4 of silicon nitride has been deposited. The polysilicon layer 6 was then deposited on the silicon nitride layer to a thickness of approximately 0.5 micron in a conventional reactor.

After deposition of the polysilicon layer, the wafers from which the samples were taken were ion implanted at room temperature with boron atoms at a density of $5 \times 10^{14}$ atoms per square centimeter energized to 60 kev. After ion implantation, the wafers were cut into the set of samples measuring 5 mm by 5 mm. Several samples were subjected to thermal annealing at 1,100° C. in thirty minute intervals in flowing dry nitrogen gas to provide standards of comparison.

Other samples were irradiated using a CW Argon laser, Model 171-09, manufactured by Spectra Physics Inc. of Mountain View, California. The laser was operated in the multiline mode with the laser output focused by a 136 mm lens onto the sample surface placed in the focal plane of the lens. The laser beam was scanned across the sample in the X and Y directions by means of two perpendicular mirrors driven by galvanometers. The calculated laser beam width at the 1/e points for a $TEM_{00}$ mode and a wavelength of 5145 angstroms was 37.2 microns. A constant scan rate of 12.5 cm per second was used. Samples annealed by laser with or without previous thermal annealing were held at a temperature between 250° C. and 350° C. with laser power varying between 11 to 14 watts.

In transmission electron microscopy samples showed a fine grained structure with average grain size of approximately 550 angstroms. The thermally annealed samples showed an average grain size of approximately 1060 angstroms. However, the laser annealed samples showed grain sizes on the order of 25 microns with some grains having a maximum length of 32 microns, thus evidencing dramatic polysilicon growth and recrystallization through laser annealing.

Electrical properties of the samples were measured including both two point probe spreading resistance and Van der Pauw measurements from which carrier concentration and Hall mobility were calculated.

The following table summarizes the measured results with each of the sample groups:

| Anneal Condition | SAMPLES | | | |
|---|---|---|---|---|
| | As Implanted | Thermal Anneal | Laser Anneal | Laser After Thermal Anneal |
| Grain Size | 300–600 Å | 900–57 1200 Å | $\overline{25\mu}$ | $\overline{25\mu}$ |
| Resistivity $\Omega/\square$ | 12.5 M$\Omega/\square$ | 623$\Omega/\infty$ | 269$\Omega/\infty$ | 260$\Omega/\square$ |
| Carrier Concentration cm$^{-3}$ | | $4.7 \times 10^{14}$ cm$^2$ | $5.2 \times 10^{14}$ cm$^2$ | $5.17 \times 10^{14}$ cm$^2$ |
| Mobility cm$^2$/V sec | | 24 | 44.5 | 46 |

It may be concluded from the measured results from testing the samples, as summarized in the above table, that laser annealing causes a significant increase in grain size. Further, the larger grains consist of relatively low defect density single crystals which are pointed in the direction of the scan line. The measured electrical properties indicate essentially 100% dopant activity and more than a factor of two decrease in resistivity in samples annealed by laser compared to those annealed thermally. Similar increases were observed in the mobility of the laser annealed samples. No significant difference was observed in the structures or electrical properties of laser annealed samples whether or not subjected to prior thermal annealing.

A similar set of experiments was performed on heavily doped polysilicon used in a commercial silicon gate MOS process. This polysilicon was doped with phosphorous in a thermal diffusion process to obtain the minimum resistivity for the polysilicon layer. After laser annealing with similar conditions described above, the resistivity decreased from 31$\Omega/\square$ to 13$\Omega/\square$.

Consider now one illustrative application of the laser annealing process in accordance with the present invention.

Referring now to FIG. 2, steps in fabricating a MOS silicon gate transistor in accordance with one embodiment of the invention is illustrated in cross section. In FIG. 2(a) a silicon substrate 10 of N- conductivity type (e.g. $10^{14}$ atoms per cubic centimeter) is shown with a silicon oxide layer 12 formed on a major surface thereof. The silicon oxide layer 12 is typically on the order of 1000 angstroms in thickness and is formed by thermal oxidation of the substrate surface.

In FIG. 2(b) a layer 14 of polycrystalline silicon is deposited by chemical vapor desposition on the surface of silicon oxide layer 12. Simultaneously with the deposition of the polycrystalline layer a P type dopant such as boron can be introduced into the evaporation chamber whereby the deposited polycrystalline silicon has a P type conductivity. Alternatively, after formation of the polycrystalline layer 14 a P type dopant such as boron can be diffused into the polycrystalline layer or implanted by conventional ion implantation means. The polycrystalline layer 12 usually has a thickness of about 0.5 micron, and the dopant concentration is about $10^{20}$ atoms per cubic centimeter.

After formation of the doped polycrystalline layer 14, in accordance with the present invention a laser beam is scanned across the surface of the layer 14. As above indicated, the scanning with a laser beam may be preceded by a thermal annealing process in which the device is subjected to an elevated temperature (e.g. 1,100° C.) for a thirty minute time period; however, the thermal annealing is unnecessary and the deleterious effects thereof can be obviated by using only laser annealing.

Following the laser annealing of the polycrystalline layer, diffusion windows 16 and 18 are formed through the polycrystalline layer 14 and the silicon oxide layer 12 by conventional photoresist masking and etching with a suitable etchant for polycrystalline silicon and silicon oxide as shown in FIG. 2(c). Thereafter, as shown in FIG. 2(d), P+ source and drain regions 20 and 22, respectively, are diffused through the windows into substrate 10. The diffusion of the source and drain regions also adds dopant to the polycrystalline layer 14. The subsequent thermal drive-in of the dopant forms an insulative coating 15 over the surface of polycrystalline material 14.

Thereafter, any oxide on the surface of substrate 10 above the source and drain regions 20, 22 is removed by etching, and metal contacts to the source and drain regions and conductive lines 24 and 26 are formed by conventional metallization techniques such as vapor deposition and selectively etching of suitable metal such as aluminums. The resulting structure is a P channel MOS transistor having metal contacts to the source and drain regions and a silicon gate 28 for the channel shown in FIG. 2(e). The doped polysilicon for contact 28 also extends over the surface of the device to make contact to ports of adjacent MOS transistors. The lower resistance of the doped polysilicon achieved through laser annealing in accordance with the invention allows the polysilicon interconnect pattern to be narrower, thus increasing the density of the transistor array structure without any resistance increase in the interconnect lines. Alternatively, when the geometry of the circuit is maintained, the circuit speed can be increased by the same factor of the reduction in resistivity due to reduced RC time constant of the interconnection.

It will be appreciated that the description of the device with reference to FIG. 2 is illustrative of one application of the invention. Modifications of the polysilicon layer formation including the steps of doping and laser annealing have been suggested. Additionally, the conductivity types of the dopants may be reversed, and formation of the source and drain regions may be accomplished by ion implantation rather than by diffusion.

Additionally, other sources of radiation can be used. Among these are pulsed lasers, continuous electron beam and pulsed electron beam. Further, a single crystal substrate such as silicon can be used without an amorphous layer by low temperature deposition of polycrystalline silicon on the substrate. Thereafter, the radiation beam can be employed to selectively form epitaxial patterns in the polycrystalline layer by effecting growth of the single crystalline structure from the substrate into the heated polycrystalline material.

As used herein, polycrystalline semiconductor material includes silicides or compounds of silicon and refractory metals such as molybdenum, platinum, and tungsten. Such materials are polycrystalline and the method in accordance with the invention can be employed to increase the crystal size by radiation exposure.

Thus, while the invention has been described with reference to specific embodiments and one specific application, the description is illustrative of the invention and is not to be construed as limiting the invention. Various modifications and applications may occur to those skilled in the art without departing from the true spirit and scope of the invention as defined by the appended claims.

What is claimed is:

1. The method of forming a low resistance circuit interconnection on a dielectric layer on a substrate comprising the steps of forming a polycrystalline semiconductor layer on said dielectric layer, doping said polycrystalline layer with a conductivity determining impurity, and applying a radiation beam to said doped polycrystalline layer thereby increasing the grain size and conductance of said doped polycrystalline layer.

2. The method as defined by claim 1 wherein said radiation beam comprises a laser.

3. The method as defined by claim 1 wherein said radiation beam comprises an electron beam.

4. The method as defined by claim 1 wherein said substrate comprises single crystal semiconductor material and said polycrystalline semiconductor layer is formed by a low temperature process.

5. The method as defined by claim 1 wherein said semiconductor is silicon, said dielectric layer comprises silicon oxide, and said polycrystalline layer comprises polycrystalline silicon.

6. The method as defined by claim 1 wherein said dielectric layer comprises silicon nitride.

7. The method as defined by claim 1 wherein said dielectric layer comprises silicon oxide.

8. The method as defined by claim 1 wherein said step of applying a radiation beam includes scanning a continuous wave beam across said deposited polycrystalline layer.

9. The method as defined by claim 1 wherein said step of applying a radiation beam includes scanning a pulsed wave beam across said deposited polycrystalline layer.

10. The method as defined by claim 1 and including before the step of applying said radiation beam the further step of thermal annealing said polycrystalline layer.

11. The method as defined by claim 1 and further including the step of removing part of said doped polycrystalline layer to define an interconnect path and electrical contacts.

12. The method as defined by claim 5 wherein said polycrystalline silicon layer is formed by chemical vapor deposition.

13. The method as defined by claim 5 wherein said polycrystalline silicon layer is formed by sputtering.

14. The method as defined by claim 5 wherein said step of doping said polycrystalline material is performed by diffusion after formation of said polycrystalline silicon material.

15. The method as defined by claim 5 wherein said step of doping said polycrystalline semiconductor material is performed by ion implantation.

16. The method as defined by claim 12 wherein the step of doping said polycrystalline layer is performed simultaneously with said chemical vapor desposition.

* * * * *